(12) United States Patent
Oh et al.

(10) Patent No.: US 9,853,238 B2
(45) Date of Patent: Dec. 26, 2017

(54) FLEXIBLE DISPLAY DEVICE INCLUDING PLURALITY OF PROTRUSIONS

(71) Applicant: Samsung Display Co., Ltd., Yongin-si, Gyeonggi-do (KR)

(72) Inventors: Hyunjoon Oh, Yongin-si (KR); Sangil Park, Yongin-si (KR); Hyejin Oh, Yongin-si (KR); Jeoungsub Lee, Yongin-si (KR); Minhoon Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 125 days.

(21) Appl. No.: 14/832,334

(22) Filed: Aug. 21, 2015

(65) Prior Publication Data

US 2016/0260927 A1 Sep. 8, 2016

(30) Foreign Application Priority Data

Mar. 2, 2015 (KR) .......................... 10-2015-0029105

(51) Int. Cl.
*H01L 29/08* (2006.01)
*H01L 51/52* (2006.01)
*H01L 51/00* (2006.01)

(52) U.S. Cl.
CPC ........ *H01L 51/524* (2013.01); *H01L 51/0097* (2013.01); *H01L 51/5246* (2013.01); *H01L 51/5259* (2013.01); *H01L 2251/5338* (2013.01); *Y02E 10/549* (2013.01)

(58) Field of Classification Search
CPC .......................... H01L 51/524; H01L 51/0097
See application file for complete search history.

(56) References Cited

U.S. PATENT DOCUMENTS

| | | | |
|---|---|---|---|
| 6,268,695 | B1 | 7/2001 | Affinito |
| 2004/0192082 | A1 | 9/2004 | Wagner et al. |
| 2010/0116526 | A1 | 5/2010 | Arora et al. |
| 2011/0141058 | A1* | 6/2011 | Onaka ..................... G06F 3/045 345/174 |
| 2011/0212304 | A1 | 9/2011 | Han et al. |
| 2013/0050605 | A1* | 2/2013 | Moriwaki ............. G02F 1/1339 349/43 |
| 2014/0144480 | A1 | 5/2014 | Lee |

FOREIGN PATENT DOCUMENTS

| | | |
|---|---|---|
| KR | 10-2011-0079500 A | 7/2011 |
| KR | 10-1404472 B1 | 5/2014 |

\* cited by examiner

*Primary Examiner* — Matthew Gordon
(74) *Attorney, Agent, or Firm* — Knobbe, Martens, Olson & Bear, LLP

(57) ABSTRACT

A flexible display device is disclosed. In one aspect, the display device includes a substrate, a display unit formed over the substrate and a filler formed over the substrate and the display unit. An encapsulation substrate is formed over the encapsulation substrate, and a barrier layer is formed over the encapsulation substrate. The encapsulation substrate includes a base layer and a plurality of protrusions formed over a first surface of the base layer and spaced apart from each other. The barrier layer is formed over the first surface so as to cover the plurality of protrusions and a portion of the base layer exposed between the plurality of protrusions, and the first surface faces the display unit.

20 Claims, 4 Drawing Sheets

FLEXIBLE DISPLAY DEVICE INCLUDING PLURALITY OF PROTRUSIONS

INCORPORATION BY REFERENCE TO ANY PRIORITY APPLICATIONS

This application claims the benefit of Korean Patent Application No. 10-2015-0029105, filed on Mar. 2, 2015, in the Korean Intellectual Property Office, the disclosure of which is incorporated herein in its entirety by reference.

BACKGROUND

Field

The described technology generally relates to a flexible display device.

Description of the Related Technology

Currently, research and development is being conducted on providing various types of display devices to be installed in electronic devices of various forms, for example, flexible display devices.

Organic light-emitting diode (OLED) display do not require an additional light source and thus can be driven with a low voltage and manufactured to be light and thin. Also, the OLED displays have favorable characteristics such as a wide viewing angle, a high contrast, and a fast response speed and thus have drawn attention as a next-generation display. However, OLEDs are can degrade due to external moisture, oxygen, etc. Thus, the OLED displays can include a barrier layer to block external moisture or oxygen.

SUMMARY OF CERTAIN INVENTIVE ASPECTS

One inventive aspect relates to a flexible display device in which cracks or delamination do not occur in a barrier layer even when the flexible display device is repeatedly bent or stretched.

Another aspect is a flexible display device that includes: a substrate; a display unit formed over the substrate; an encapsulation substrate formed opposite the substrate; a filler applied between the substrate and the encapsulation substrate to cover the display unit; and a barrier layer formed over the encapsulation substrate. The encapsulation substrate includes a base layer; and a plurality of protrusions formed over a first surface of the base layer to be spaced apart from each other. The barrier layer is formed over the first surface to cover the plurality of protrusions and a portion of the base layer exposed between the plurality of protrusions. The first surface faces the display unit.

Each of the plurality of protrusions can have a columnar shape extending from the first surface in a direction perpendicular to the first surface.

Each of the plurality of protrusions can include a first end portion in contact with the first surface; and a second end portion formed opposite the first end portion. A horizontal sectional area of each of the plurality of protrusions can decrease in a direction from the first end portion to the second end portion.

The second end portion can have an outwardly curved shape.

The encapsulation substrate can be two-dimensionally stretchable, and the plurality of protrusions and the base layer can be integrally formed of a same material.

When the encapsulation substrate is stretched, an elongation percentage of the encapsulation substrate at the first end portion can be greater than an elongation percentage of the encapsulation substrate between the plurality of protrusions.

The barrier layer can include at least one organic layer; and at least one inorganic layer.

The flexible display device can further include a sealer applied between the substrate and the encapsulation substrate along outer sides of the display unit.

The flexible display device can further include a getter between the outer sides of the display unit and the sealer.

The display unit can include an organic light-emitting device; and a thin-film transistor electrically connected to the organic light-emitting device.

Another aspect is a flexible display device that includes: a substrate; a display unit formed over the substrate; an encapsulation substrate formed opposite the substrate and including a base layer and a plurality of protrusions formed over a first surface of the base layer; a filler applied between the substrate and the encapsulation substrate to cover the display unit; and a barrier layer formed over the first surface to cover the plurality of protrusions and a portion of the base layer exposed between the plurality of protrusions. The substrate, the filler, and the encapsulation substrate are two-dimensionally stretchable. Each of the plurality of protrusions includes a first end portion in contact with the first surface, and a second end portion formed opposite the first end portion. When the encapsulation substrate is stretched, an elongation percentage of the encapsulation substrate at the first end portion is greater than an elongation percentage of the encapsulation substrate between the plurality of protrusions.

The first surface can face the display unit.

The plurality of protrusions can be spaced apart from each other and formed as a same material as the base layer to be integrally formed with the base layer.

Each of the plurality of protrusions can have a columnar shape extending from the first surface in a direction perpendicular to the first surface.

A horizontal sectional area of each of the plurality of protrusions can decrease in a direction from the first end portion to the second end portion.

The barrier layer can include at least one organic layer; and at least one inorganic layer.

Spaces between the plurality of protrusions can be filed with the filler.

The flexible display device can further include a sealer applied between the substrate and the encapsulation substrate along outer surfaces of the display unit.

The flexible display device can further include a getter between the outer surfaces of the display unit and the sealer.

The display unit can include an organic light-emitting device; and a thin-film transistor electrically connected to the organic light-emitting device.

Another aspect is a flexible display device, comprising: a substrate; a display unit formed over the substrate; a filler formed over the substrate and the display unit; an encapsulation substrate formed over the encapsulation substrate; and a barrier layer formed over the encapsulation substrate. The encapsulation substrate comprises: a base layer; and a plurality of protrusions formed over a first surface of the base layer and spaced apart from each other, wherein the barrier layer is formed over i) the first surface so as to cover the plurality of protrusions and ii) a portion of the base layer exposed between the plurality of protrusions, and wherein the first surface faces the display unit.

In the above flexible display device, each of the plurality of protrusions has a columnar shape extending in a direction crossing the first surface.

In the above flexible display device, each of the plurality of protrusions comprises: a first end portion contacting the first surface; and a second end portion formed below the first end portion, wherein a horizontal sectional area of each of the plurality of protrusions at the first end portion is greater than a horizontal sectional area of each of the plurality of protrusions at the second end portion.

In the above flexible display device, the second end portion is curved outwardly.

In the above flexible display device, the encapsulation substrate is configured to be stretched in two dimensions, wherein the plurality of protrusions and the base layer are integrally formed of the same material.

In the above flexible display device, an elongation percentage of the encapsulation substrate at the first end portion is greater than an elongation percentage of the encapsulation substrate between the plurality of protrusions when the encapsulation substrate is stretched.

In the above flexible display device, the barrier layer comprises: at least one organic layer; and at least one inorganic layer.

The above flexible display device further comprises a sealer formed between the substrate and the encapsulation substrate, wherein the sealer is formed to the left of the leftmost side of the display unit and to the right of the rightmost side of the display unit.

The above flexible display device further comprises a getter formed between the display unit and the sealer.

In the above flexible display device, the display unit comprises: an organic light-emitting diode; and a thin-film transistor electrically connected to the organic light-emitting diode.

Another aspect is a flexible display device, comprising: a substrate; a display unit formed over the substrate; an encapsulation substrate formed over the substrate and the display unit and including a base layer and a plurality of protrusions formed over a first surface of the base layer; a filler interposed between the substrate and the encapsulation substrate so as to cover the display unit; and a barrier layer formed over i) the first surface so as to cover the protrusions and ii) a portion of the base layer is exposed to the barrier layer between the plurality of protrusions, wherein the substrate, the filler, and the encapsulation substrate are configured to be stretched in two dimensions. Each of the plurality of protrusions comprises: a first end portion contacting the first surface; and a second end portion formed below the first end portion, wherein an elongation percentage of the encapsulation substrate at the first end portion is greater than an elongation percentage of the encapsulation substrate between the plurality of protrusions when the encapsulation substrate is stretched.

In the above flexible display device, the first surface of the base layer faces the display unit.

In the above flexible display device, the plurality of protrusions are spaced apart from each other, formed of the same material as the base layer, and integrally formed with the base layer.

In the above flexible display device, each of the plurality of protrusions has a columnar shape extending in a direction crossing the first surface.

In the above flexible display device, a horizontal sectional area of each of the plurality of protrusions at the first end portion is greater than a horizontal sectional area of each of the plurality of protrusions at the second end portion.

In the above flexible display device, the barrier layer comprises: at least one organic layer; and at least one inorganic layer.

In the above flexible display device, the filler is formed between the protrusions.

The above flexible display device further comprises a sealer formed between the substrate and the encapsulation substrate, wherein the sealer is formed to the left of the leftmost side of the display unit and to the right of the right most side of the display unit.

The above flexible display device further comprises a getter formed between the display unit and the sealer.

In the above flexible display device, the display unit comprises: an organic light-emitting diode; and a thin-film transistor electrically connected to the organic light-emitting diode.

DETAILED DESCRIPTION OF CERTAIN INVENTIVE EMBODIMENTS

Figure 1:
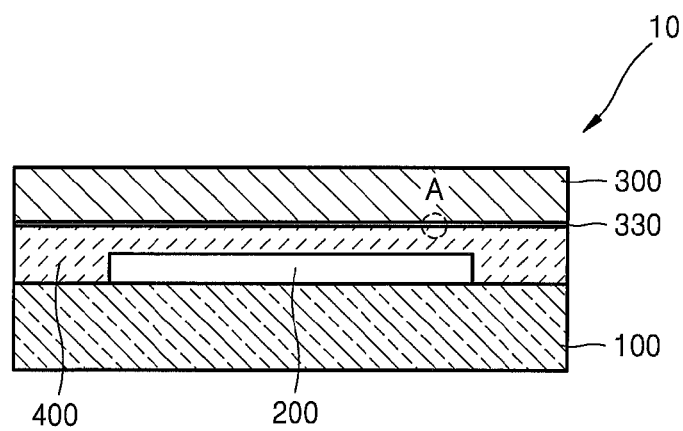
FIG. 1 is a schematic cross-sectional view of a flexible display device according to an exemplary embodiment.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description. It would be obvious to those of ordinary skill in the art that exemplary embodiments are to cover all modifications, equivalents, and alternatives falling within the scope of the described technology. In the following description, well-known functions or constructions are not described in detail if it is determined that they would obscure the inventive concept due to unnecessary detail.

It will be understood that although the terms "first", "second", etc. can be used herein to describe various components, these components should not be limited by these terms. These terms are only used to distinguish one component from another.

The terminology used herein is for the purpose of describing particular embodiments only and is not intended to be limiting of the described technology. As used herein, the singular forms "a", "an" and "the" are intended to include the plural forms as well, unless the context clearly indicates otherwise. In the drawings, elements can be exaggerated, omitted, or schematically illustrated for convenience of explanation. In other words, since sizes and thicknesses of components in the drawings are illustrated for convenience of explanation, the following embodiments are not limited thereto.

It will be understood that when a layer, region, or component is referred to as being "formed on" or "formed under," another layer, region, or component, it can be directly or indirectly formed on or under the other layer, region, or component. That is, for example, intervening layers, regions, or components can be present.

Hereinafter, exemplary embodiments will be described in detail with reference to the accompanying drawings. In the drawings, components that are substantially the same or that correspond to each other will be denoted by the same reference numeral and will not be redundantly described here.

As used herein, the term "and/or" includes any and all combinations of one or more of the associated listed items. Expressions such as "at least one of," when preceding a list of elements, modify the entire list of elements and do not modify the individual elements of the list. In this disclosure, the tem). "substantially" includes the meanings of completely, almost completely or to any significant degree under some applications and in accordance with those skilled in the art. The term "connected" can include an electrical connection.

Figure 2:
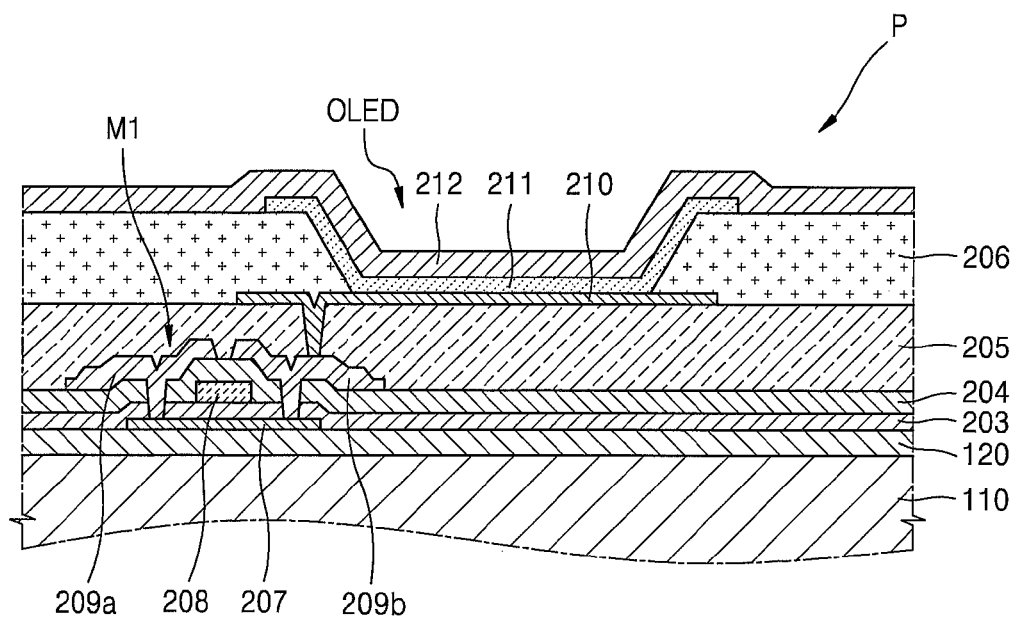
FIG. 2 is a schematic cross-sectional view of an example of a pixel unit included in a display unit of the flexible display device of FIG. 1.
Figure 3:
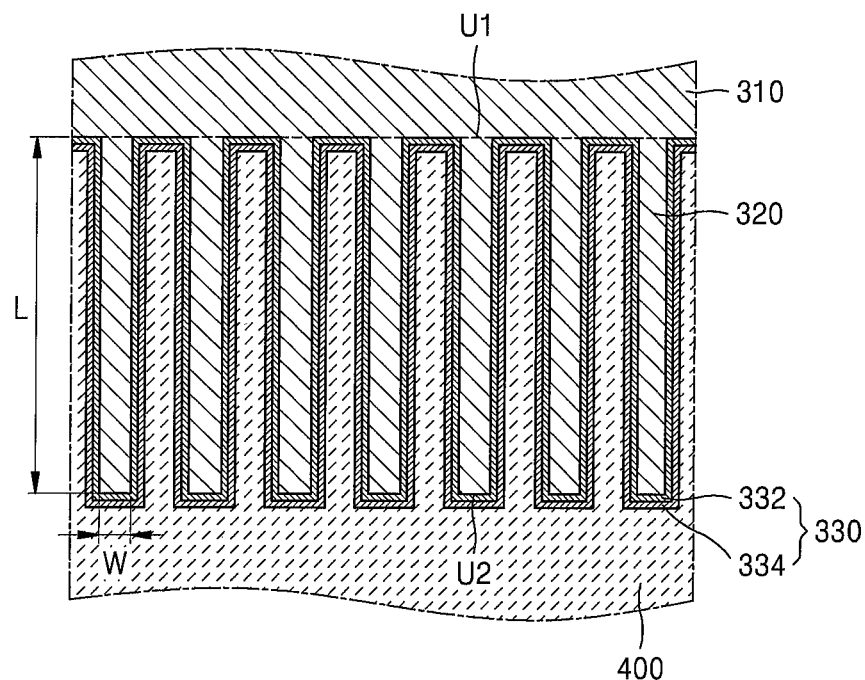
FIG. 3 is a schematic enlarged cross-sectional view of a region A of FIG. 1.
Figure 4:
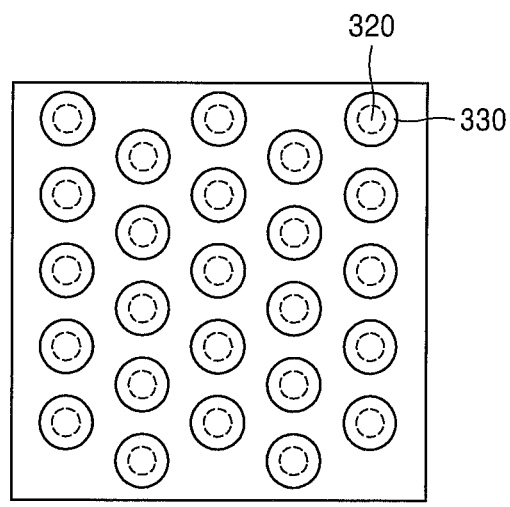
FIG. 4 is a schematic plan view of an encapsulation substrate of the flexible display device of FIG. 1 according to an exemplary embodiment.

FIG. 1 is a schematic cross-sectional view of a flexible display device 10 according to an exemplary embodiment. FIG. 2 is a schematic cross-sectional view of an example of a pixel unit (or pixel) P included in a display unit 200 of the flexible display device 10 of FIG. 1. FIG. 3 is a schematic enlarged cross-sectional view of a region A of FIG. 1. FIG. 4 is a schematic plan view of an encapsulation substrate 300 of the flexible display device 10 of FIG. 1 according to an exemplary embodiment.

Referring to FIGS. 1 to 4, the flexible display device 10 according to an exemplary embodiment includes a substrate 100, the display unit 200 formed on the substrate 100, an encapsulation substrate 300 formed opposite the substrate 100, a filler 400 for covering the display unit 200 between the substrate 100 and the encapsulation substrate 300, and a barrier layer 330 formed on the encapsulation substrate 300.

The substrate 100 can be formed of a material having a high elongation percentage. For example, the substrate 100 is formed of a material having a Poisson's ratio of about 0.4 or more. The Poisson's ratio is a shrinkage ratio of a material in one direction when the material is stretched in another direction to increase the length thereof. That the material of the substrate 100 has the Poisson's ratio of about 0.4 or more means that the substrate 100 has a property of being easily stretched.

In the present embodiment, the substrate 100 is formed of at least one of silicone-based polymer, polyurethane, polyurethane acrylate, acrylate polymer, and acrylate terpolymer. The silicone-based polymer can include, for example, polydimethylsiloxane (PDMS), hexamethyldisiloxane (HMDSO), etc. Thus, the substrate 100 can have a flexible property and be two-dimensionally stretchable.

The substrate 100 can include a plurality of islands 110 arranged in a plane lattice form, and a base unit (not shown) that is formed between the islands 110 to be lower than the islands 110 in terms of height. Thus, when the substrate 100 is stretched, the length of the base unit can increase and the islands 110 which are thick can change less in shape compared to the base unit.

The display unit 200 can include a plurality of pixel units P. For example, the pixel units P formed on the islands 110. Thus, even if the substrate 100 is two-dimensionally stretched or is bent, the pixel units P formed on the islands 110 that are changed less in shape can be prevented from being damaged.

The pixel units P can each include R, G, and B sub-pixels. The R, G, and B sub-pixels can each include a thin-film transistor (TFT) M1 and an organic light-emitting diode (OLED) on the substrate 100.

An insulating layer 120 such as a barrier layer and/or a buffer layer can be formed on an upper surface of the substrate 100, e.g., at least upper surfaces of the islands 110, to prevent impurity ions from diffusing via the substrate 100, prevent moisture or air from permeating the flexible display device 10, and provide a flat surface.

An active layer 207 of the TFT M1 can be formed on the insulating layer 120 by using a semiconductor material, and a gate insulating film 203 can be formed to cover the active layer 207. The active layer 207 can be formed of an inorganic semiconductor such as amorphous silicon or polysilicon, or an organic semiconductor.

A gate electrode 208 is formed on the gate insulating film 203, and an interlayer insulating film 204 is formed to cover the gate electrode 208. A source electrode 209a and a drain electrode 209b are formed on the interlayer insulating film 204. A passivation film 205 and a pixel defining film 206 are sequentially formed to cover the source electrode 209a and the drain electrode 209b.

The gate electrode 208, the source electrode 209a, and the drain electrode 209b can be formed of a metal such as Al, Mo, Au, Ag, Pt/Pd, Cu, etc. but is not limited thereto. The gate electrode 208, the source electrode 209a, and the drain electrode 209b can be formed by applying a resin paste including one or more of these metals in a powder form or formed using a conductive polymer.

The gate insulating film 203, the interlayer insulating film 204, the passivation film 205, and the pixel defining film 206 can be insulators, have a single-layer structure or a multilayer structure, and be formed of an organic material, an inorganic material, or a combination thereof.

The OLED displays image information by emitting red, green, blue, or white light according to the flow of current. The OLED can include a pixel electrode 210 connected to one of the source electrode 209a and the drain electrode 209b of the TFT M1, an opposite electrode 212 formed to cover all pixels, and an organic emission film 211 formed between the pixel electrode 210 and the opposite electrode 212 to emit light.

The pixel units P can be directly formed on the islands 110, or formed on a carrier substrate (not shown) and transferred onto the islands 110.

The filler 400 is formed to fill a space between the substrate 100 and the encapsulation substrate 300, and can prevent or delay permeation of external moisture and oxygen into the flexible display device 10. Also, the filler 400 can protect the flexible display device 10 to not be damaged by shock, etc. and secure the mechanical stability of the flexible display device 10. The filler 400 can be formed of a stretchable material. For example, the filler 400 is formed of elastomeric polyurethane, elastomeric silicone, etc.

The encapsulation substrate 300 can be formed of at least one of silicone-based polymer, polyurethane, polyurethane acrylate, acrylate polymer, and acrylate terpolymer. The silicon-based polymer can include, for example, at least one of polydimethylsiloxane (PDMS) and hexamethyldisiloxane (HMDSO). Thus, the encapsulation substrate 300 can have a flexible property and be two-dimensionally stretched.

The encapsulation substrate 300 can include a base layer 310 and a plurality of protrusions 320 formed on a first surface of the base layer 310. The first surface can face the display unit 200.

The base layer 310 and the protrusions 320 can be integrally formed of the same material. For example, the base layer 310 and the protrusions 320 are substantially simultaneously or concurrently formed by molding, or the protrusions 320 can be formed on the first surface of the base layer 310 by photolithography.

The protrusions 320 can be spaced apart from each other, and have a columnar shape extending from the first surface in a direction substantially perpendicular to the first surface. Thus, the protrusions 320 can each include a first end portion U1 that is in contact with the first surface, and a second end portion U2 opposite the first end portion U1.

The protrusions 320 can be spaced a predetermined distance from each other to form a predetermined pattern. For example, the protrusions 320 have a pattern in which triangles, quadrangles, honeycomb structures, or the like are repeatedly arranged. Otherwise, the protrusions 320 can have a random pattern. A shape of a horizontal sectional area of each of the protrusions 320 is not limited. That is, the horizontal sectional areas of the protrusions 320 can have a round shape as illustrated in FIG. 4 or have other various shapes such as a polygonal shape.

The barrier layer 330 covers the protrusions 320 and a portion of the base layer 310 exposed between the protrusions 320. That is, the barrier layer 330 is formed on surfaces of the protrusions 320 and the portion of the base layer 310 exposed between the protrusions 320. Thus, external moisture and oxygen can be effectively prevented from permeating the display unit 200 using the encapsulation substrate 300.

The barrier layer 330 can include at least one organic layer 332 and at least one inorganic layer 334. The at least one organic layer 332 and the at least one inorganic layer 334 can be alternately stacked. When the at least one organic layer 332 and the at least one inorganic layer 334 are alternately stacked, one of the at least one organic layer 332 can be first formed in consideration of an adhesive strength between the barrier layer 330 and the encapsulation substrate 300.

The at least one organic layer 332 can be formed of at least one of acryl-based resin, methacryl-based resin, polyisoprene, vinyl-based resin, epoxy-based resin, urethane-based resin, cellulose-based resin, and perylene-based resin.

The at least one inorganic layer 334 can be formed of at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The protrusions 320 on which the barrier layer 330 are formed can be formed to face downward, i.e., to face the display unit 200. The spaces between the protrusions 320 on which the barrier layer 330 is formed can be filled with the filler 400.

Figure 5:
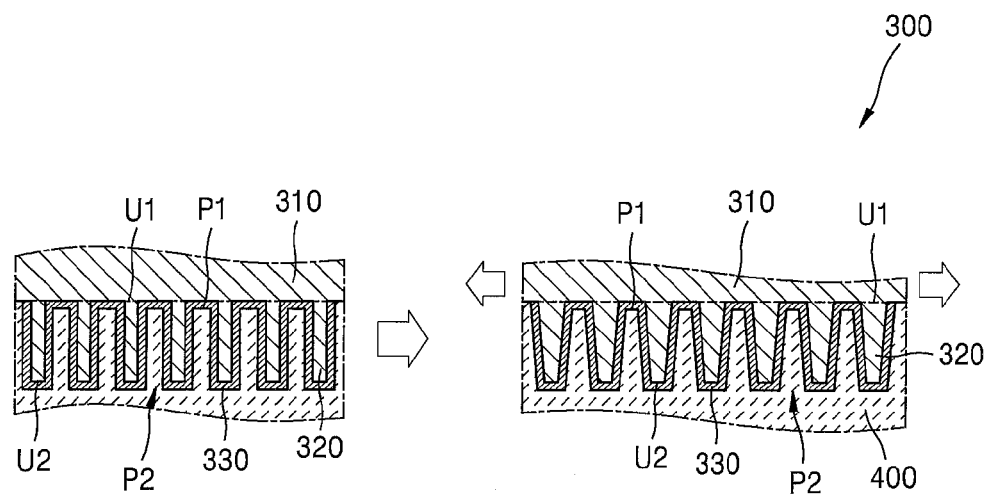
FIG. 5 is a schematic cross-sectional view of the encapsulation substrate when the flexible display device of FIG. 1 is stretched.

FIG. 5 is a schematic cross-sectional view of the encapsulation substrate 300 when the flexible display device 10 of FIG. 1 is stretched. As illustrated in FIG. 5, when the encapsulation substrate 300 is stretched, an elongation percentage of the encapsulation substrate 300 at the first end portion U1 can be different from that of the encapsulation substrate 300 at the second end portion U2. For example, when the encapsulation substrate 300 is stretched, the area of the first end portion U1 to which a force is applied increases but the area of the second end portion U2 on which the barrier layer 330 having a hard property is formed does not increase. Thus, if vertical sections of the protrusions 320 have, for example, a substantially rectangular shape, the vertical sections of the protrusions 320 can change into a substantially trapezoidal shape, the upper side of which is longer than the lower side thereof when the encapsulation substrate 300 is stretched.

The at least one inorganic layer 334 included in the barrier layer 330 has a hard property. Thus, when the shapes of the protrusions 320 change, cracks or the like can occur in the at least one inorganic layer 334.

A strain applied to the protrusions 320 when the first end portions U1 are stretched 100% without changing the shape of the second end portions U2 of the protrusions 320 can be calculated by Equation 1 below.

$$\text{strain } (\%) = \left( \sqrt{1 + \left(\frac{W}{2L}\right)^2} - 1 \right) \times 100 \quad \text{Equation 1}$$

According to Equation 1, if a ratio between the width W and length L of the protrusions 320 is 1:16 or more, the strain applied to the protrusions 320 is 0.05% or less when the first end portions U1 of the protrusions 320 are stretched 100%. In this case, the at least one inorganic layer 334 of the barrier layer 330 formed on side surfaces of the protrusions 320 is not damaged. That is, if the ratio between the width W and length L of the protrusions 320 is 1:16 or more, the at least one inorganic layer 334 of the barrier layer 330 can be stably maintained even when the encapsulation substrate 300 is stretched 100%.

Similarly, when the first end portions U1 of the protrusions 320 are stretched about 50% without changing the shapes of the second end portions U2 of the protrusions 320, the ratio between the width W and length L of the protrusions 320 can be set to be about 1:8 or more so that the at least one inorganic layer 334 of the barrier layer 330 is not damaged. When the first end portions U1 of the protrusions 320 are stretched about 30% without changing the shapes of the second end portions U2 of the protrusions 320, the ratio between the width W and length L of the protrusions 320 can be set to be about 1:5 or more so that the at least one inorganic layer 334 of the barrier layer 330 is not damaged. Accordingly, the length L and width W of the protrusions 320 can be appropriately adjusted according to the elongation percentage of the flexible display device 10.

When the flexible display device 10 is stretched, the filler 400 is also stretched. In this case, an elongation percentage of the filler 400 in a first region P1 between the first end portions U1 can be different from that of the filler 400 in a second region P2 between the second end portions U2. That is, in some embodiments, when the filler 400 is stretched, the area of the second region P2 to which a force is applied can increase and the area of the first region P1 that is in contact with the barrier layer 330 having a hard property does not increase. Thus, when the encapsulation substrate 300 is stretched, the elongation percentage of the filler 400 at the first end portions U1 can be greater than that of the filler 400 between adjacent first end portions U1.

Also, stress applied to the barrier layer 330 when the flexible display device 10 is stretched can be substantially evenly dispersed due to the first end portions U1 and the second regions P2. Thus, even if the flexible display device 10 is repeatedly bent or stretched, cracks or delamination do not occur in the barrier layer 330.

Figure 6:
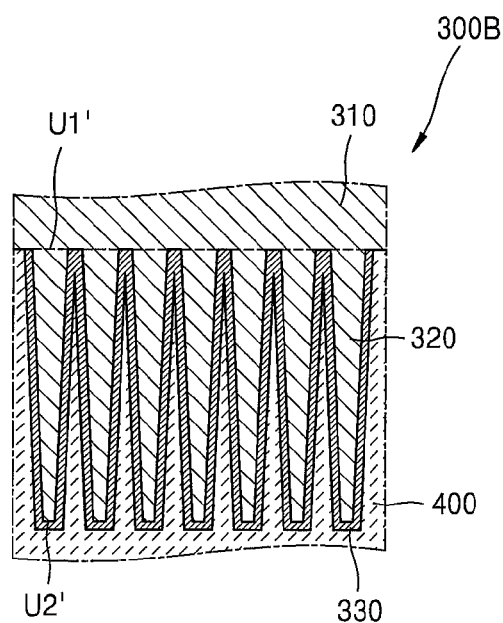
FIG. 6 is a schematic plan view of an encapsulation substrate of the flexible display device of FIG. 1 according to another exemplary embodiment.
Figure 7:
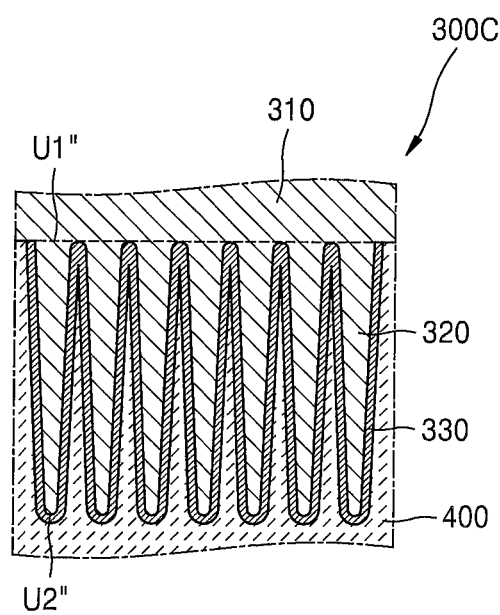
FIG. 7 is a schematic plan view of an encapsulation substrate of the flexible display device of FIG. 1 according to another exemplary embodiment.

FIG. 6 is a schematic plan view of an encapsulation substrate 300B of the flexible display device 10 of FIG. 1 according to another exemplary embodiment. FIG. 7 is a schematic plan view of an encapsulation substrate 300C of the flexible display device 10 of FIG. 1 according to another exemplary embodiment.

Referring to FIG. 6, the encapsulation substrate 300B includes a base layer 310 and a plurality of protrusions 320 formed on a first surface of the base layer 310. The base layer 310 and the protrusions 320 can be integrally formed of the same material. The base layer 310 and the protrusions 320 can each be formed of at least one of silicone-based polymer, polyurethane, polyurethane acrylate, acrylate polymer, and acrylate terpolymer. The silicon-based polymer can be formed of, for example, polydimethylsiloxane (PDMS), hexamethyldisiloxane (HMDSO), etc.

The protrusions 320 can be spaced apart from each other, and have a columnar shape extending from the first surface in a direction substantially perpendicular to the first surface. The protrusions 320 can each include a first end portion U1' that is in contact with the first surface, and a second end portion U2' formed opposite the first end portion U1'. A barrier layer 330 can be formed on surfaces of the protrusions 320. A filler 400 can be filled between the protrusions 320 on which the barrier layer 330 is formed.

Horizontal sectional areas of the protrusions 320 can decrease in a direction from the first end portions U1' to the second end portions U2'. Thus, the protrusions 320 can be easily manufactured by molding, the barrier layer 330 can be substantially uniformly formed on the surfaces of the protrusions 320, and a filler (not shown) can be easily filled between the protrusions 320 on which the barrier layer 330 is formed.

Since the horizontal sectional areas of the protrusions 320 decrease in the direction from the first end portions U1' to the second end portions U2', the areas of spaces between the first end portions U1' can decrease. Thus, the barrier layer 330 can be more effectively prevented from being damaged when the flexible display device 10 is repeatedly bent or stretched.

The encapsulation substrate 300C of FIG. 7 can include a base layer 310 and a plurality of protrusions 320 formed on a first surface of the base layer 310. A barrier layer 330 can be formed on surfaces of the protrusions 320 and a portion of the base layer 310 exposed between the protrusions 320. A filler 400 can be filled between the protrusions 320 on which the barrier layer 330 is formed.

The encapsulation substrate 300C of FIG. 7 includes curved surfaces between first end portions U1" and at second end portions U2", compared to the encapsulation substrate 300B of FIG. 6. That is, the second end portions U2" can have an outwardly curved shape, and spaces between the first end portions U1" can be inwardly curved toward the base layer 310. Thus, a stress that is likely to be intensively applied to an angular portion can be more effectively dispersed.

Figure 8:
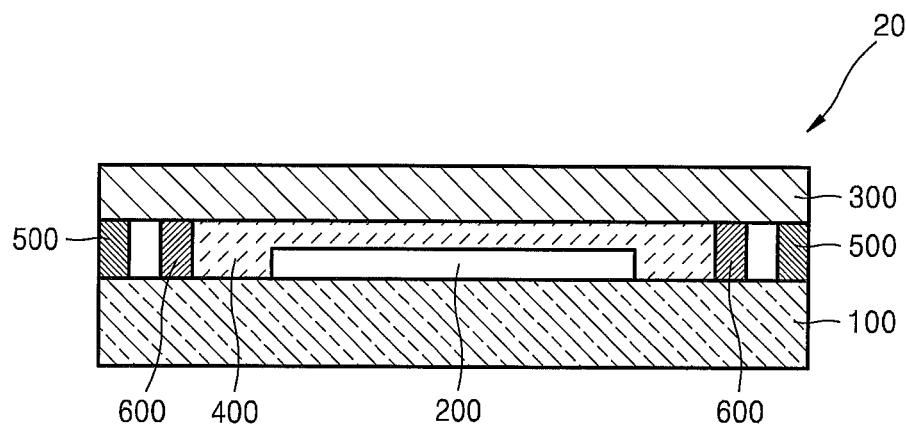
FIG. 8 is a schematic cross-sectional view of a modified example of the flexible display device of FIG. 1.

FIG. 8 is a schematic cross-sectional view of a flexible display device 20 which is a modified example of the flexible display device 10 of FIG. 1.

The flexible display device 20 of FIG. 8 can include a substrate 100, a display unit 200 on the substrate 100, an encapsulation substrate 300 formed opposite the substrate 100, a filler 400 for covering the display unit 200 between the substrate 100 and the encapsulation substrate 300, and a sealer 500 applied along outer surfaces of the display unit 200 to fill a space between the substrate 100 and the encapsulation substrate 300.

The substrate 100, the display unit 200, the encapsulation substrate 300, and the filler 400 are as described above with reference to FIGS. 1 to 5 and are thus not described again here.

The sealer 500 can be applied on the outer surfaces of the display unit 200 to combine the substrate 100 and the encapsulation substrate 300, and prevent external moisture and oxygen from permeating the flexible display device 20. The sealer 500 can be formed of, for example, UV curing resin or thermosetting resin such as elastomeric silicon.

The flexible display device 20 of FIG. 8 can further include a getter 600. The getter 600 can be applied between the outer surfaces of the display unit 200 and inner sides of the sealer 500. The getter 600 can be formed of one of alkali metal oxide, alkaline-earth metal oxide, metal halide, lithium sulfate, metal sulfate, metal chlorate, silica gel, and phosphorous pentoxide that easily react with moisture and oxygen so as to prevent the lifetime of an OLED or the like from decreasing due to moisture and oxygen.

As described above, according to the one or more of the above exemplary embodiments, even if a flexible display device is repeatedly bent or stretched, cracks or delamination can be prevented from occurring in a barrier layer.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technologies have been described with reference to the figures, it will be understood by those of ordinary skill in the art that various changes in form and details can be made therein without departing from the spirit and scope as defined by the following claims.

What is claimed is:

1. A flexible display device, comprising:
  a substrate;
  a display unit formed over the substrate;
  a filler formed over the substrate and the display unit;
  an encapsulation substrate formed over the filler; and
  a barrier layer formed over the encapsulation substrate,
  wherein the encapsulation substrate comprises:
    a base layer; and
    a plurality of protrusions formed over a first surface of the base layer and spaced apart from each other,
    wherein the barrier layer is formed over the first surface so as to cover i) the plurality of protrusions and ii) a portion of the base layer exposed between the plurality of protrusions, and
    wherein the first surface faces the display unit.

2. The flexible display device of claim 1, wherein each of the plurality of protrusions has a columnar shape extending in a direction crossing the first surface.

3. The flexible display device of claim 1, wherein each of the plurality of protrusions comprises:
  a first end portion contacting the first surface; and
  a second end portion formed below the first end portion,
    wherein a horizontal sectional area of each of the plurality of protrusions at the first end portion is greater than a horizontal sectional area of each of the plurality of protrusions at the second end portion.

4. The flexible display device of claim 3, wherein the second end portion is curved outwardly.

5. The flexible display device of claim 3, wherein the encapsulation substrate is configured to be stretched in two dimensions, and wherein the plurality of protrusions and the base layer are integrally formed of the same material.

6. The flexible display device of claim 5, wherein an elongation percentage of the encapsulation substrate at the first end portion is greater than an elongation percentage of the encapsulation substrate between the plurality of protrusions when the encapsulation substrate is stretched.

7. The flexible display device of claim 1, wherein the barrier layer comprises:
at least one organic layer; and
at least one inorganic layer.

8. The flexible display device of claim 1, further comprising a sealer formed between the substrate and the encapsulation substrate, and surrounding the display unit.

9. The flexible display device of claim 8, further comprising a getter formed between the display unit and the sealer.

10. The flexible display device of claim 1, wherein the display unit comprises:
an organic light-emitting diode; and
a thin-film transistor electrically connected to the organic light-emitting diode.

11. A flexible display device, comprising:
a substrate;
a display unit formed over the substrate;
an encapsulation substrate formed over the substrate and the display unit and including a base layer and a plurality of protrusions formed over a first surface of the base layer;
a filler interposed between the substrate and the encapsulation substrate so as to cover the display unit; and
a barrier layer formed over the first surface so as to cover i) the protrusions and ii) a portion of the base layer exposed between the plurality of protrusions,
wherein the substrate, the filler, and the encapsulation substrate are configured to be stretched in two dimensions, and
wherein each of the plurality of protrusions comprises:
a first end portion contacting the first surface; and
a second end portion formed opposite the first end portion,
wherein an elongation percentage of the encapsulation substrate at the first end portion is greater than an elongation percentage of the encapsulation substrate between the plurality of protrusions when the encapsulation substrate is stretched.

12. The flexible display device of claim 11, wherein the first surface of the base layer faces the display unit.

13. The flexible display device of claim 12, wherein the plurality of protrusions are spaced apart from each other, formed of the same material as the base layer, and integrally formed with the base layer.

14. The flexible display device of claim 12, wherein each of the plurality of protrusions has a columnar shape extending in a direction crossing the first surface.

15. The flexible display device of claim 12, wherein a horizontal sectional area of each of the plurality of protrusions at the first end portion is greater than a horizontal sectional area of each of the plurality of protrusions at the second end portion.

16. The flexible display device of claim 12, wherein the barrier layer comprises:
at least one organic layer; and
at least one inorganic layer.

17. The flexible display device of claim 12, further comprising a sealer formed between the substrate and the encapsulation substrate, and surrounding the display unit.

18. The flexible display device of claim 17, further comprising a getter formed between the display unit and the sealer.

19. The flexible display device of claim 11, wherein the filler is formed between the protrusions.

20. The flexible display device of claim 12, wherein the display unit comprises:
an organic light-emitting diode; and
a thin-film transistor electrically connected to the organic light-emitting diode.

* * * * *

UNITED STATES PATENT AND TRADEMARK OFFICE
CERTIFICATE OF CORRECTION

PATENT NO. : 9,853,238 B2
APPLICATION NO. : 14/832334
DATED : December 26, 2017
INVENTOR(S) : Adest et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 589 days.

Signed and Sealed this
First Day of May, 2018

Andrei Iancu
*Director of the United States Patent and Trademark Office*